(12) United States Patent
Karita (10) Patent No.: US 9,239,341 B2
(45) Date of Patent: Jan. 19, 2016

(54) WIRING FAULT DETECTION METHOD, WIRING FAULT DETECTION APPARATUS, AND METHOD FOR MANUFACTURING SEMICONDUCTOR SUBSTRATE

(75) Inventor: Yuji Karita, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 114 days.

(21) Appl. No.: 14/236,992

(22) PCT Filed: Aug. 30, 2012

(86) PCT No.: PCT/JP2012/072021
§ 371 (c)(1),
(2), (4) Date: Feb. 4, 2014

(87) PCT Pub. No.: WO2013/031900
PCT Pub. Date: Mar. 7, 2013

(65) Prior Publication Data
US 2014/0159759 A1    Jun. 12, 2014

(30) Foreign Application Priority Data
Aug. 31, 2011  (JP) .................................. 2011-189647

(51) Int. Cl.
| | | |
|---|---|---|
| G01R 31/302 | (2006.01) | |
| G01R 31/26 | (2014.01) | |
| G01R 1/07 | (2006.01) | |
| G09G 3/00 | (2006.01) | |
| H01L 21/66 | (2006.01) | |
| G01R 31/28 | (2006.01) | |

(52) U.S. Cl.
CPC *G01R 1/07* (2013.01); *G09G 3/006* (2013.01); *H01L 22/14* (2013.01); *G01R 31/2805* (2013.01); *G09G 2360/145* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,740,272 | A * | 4/1998 | Shimada | 382/149 |
| 6,809,532 | B2 * | 10/2004 | Araki | 324/754.21 |
| 6,840,666 | B2 * | 1/2005 | Enachescu et al. | 374/5 |
| 7,474,115 | B1 * | 1/2009 | Trujillo et al. | 324/762.07 |
| 2002/0093354 | A1 | 7/2002 | Enachescu et al. | |

(Continued)

FOREIGN PATENT DOCUMENTS

| | | |
|---|---|---|
| CN | 1395112 A | 2/2003 |
| JP | 4-348266 A | 12/1992 |

(Continued)

OTHER PUBLICATIONS

Official Communication issued in corresponding Chinese Patent Application No. 201280039453.4, mailed on Jan. 12, 2015.

(Continued)

*Primary Examiner* — Minh N Tang
(74) *Attorney, Agent, or Firm* — Keating & Bennett, LLP (57) ABSTRACT

A wiring fault detection method according to an embodiment of the present invention is capable of determining that, in a case where a temperature rise value of a faulty portion exceeds a temperature rise threshold within a preset threshold of the number of frames, a corresponding pixel has a fault. A wiring fault detection apparatus according to the present invention includes a temperature measurement imaging unit that measure a temperature of a semiconductor substrate and forms an image thereof.

4 Claims, 8 Drawing Sheets

(56) References Cited

U.S. PATENT DOCUMENTS

2002/0180467 A1  12/2002  Araki
2004/0124358 A1   7/2004  Okamura et al.

FOREIGN PATENT DOCUMENTS

| | | |
|---|---|---|
| JP | 6-207914 A | 7/1994 |
| JP | 2002-350491 A | 12/2002 |
| JP | 2003-215081 A | 7/2003 |
| JP | 2005-503532 A | 2/2005 |

OTHER PUBLICATIONS

Jin-ping L. et al., "Pre-Earthquake Thermal Infrared Anomaly Recognition Method and Quantitative Analysis Model" Journal of China University of Mining and Technology, vol. 37, No. 6, Nov. 2008, pp. 808-813.

Official Communication issued in International Patent Application No. PCT/JP2012/072021, mailed on Nov. 6, 2012.

* cited by examiner

FIG. 6
SEQUENCE BEFORE VOLTAGE IS APPLIED (9 FRAMES)

FIG. 7
TEMPERATURE CHANGE CURVE OF FAULTY PORTION

FIG. 8

FIG. 9

WIRING FAULT DETECTION METHOD, WIRING FAULT DETECTION APPARATUS, AND METHOD FOR MANUFACTURING SEMICONDUCTOR SUBSTRATE

TECHNICAL FIELD

The present invention relates to a wiring fault detection method and a wiring fault detection apparatus that are suitable for detecting a fault of a wiring line formed on a semiconductor substrate, such as a liquid crystal panel or a solar battery panel, and to a method for manufacturing a semiconductor substrate.

BACKGROUND ART

A process for manufacturing a liquid crystal panel, which is an example of a semiconductor substrate, roughly includes an array (TFT) step, a cell (liquid crystal) step, and a module step. In the array step among these steps, gate electrodes, a semiconductor film, source/drain electrodes, a protection film, and transparent electrodes are formed on a transparent substrate, and then array detection is performed, so that the presence/absence of a short circuit of wiring, such as an electrode or a wiring line, is detected.

Normally, in array detection, such a fault is specified by causing a probe to be in contact with an end portion of a wiring line and measuring an electric resistance at both ends of the wiring line or an electric resistance and electric capacitance between wiring lines adjacent to each other. However, even if the presence/absence of a fault in a wiring portion can be detected through array detection, it is not easy to specify the position of the fault.

For example, as a method for addressing the above-described problem and specifying the position of a fault, infrared detection is available in which a voltage is applied to a leak fault substrate to generate heat, and the position of a fault is specified using an image that is captured by an infrared camera and that indicates the temperature of the surface of the leak fault substrate.

PTL 1 relates to infrared detection in which a short-circuit fault of a substrate is detected using an infrared image. With a difference image representing the difference between infrared images of substrates before and after a voltage is applied, a wiring line in which heat is generated can be detected, and the position of the fault can be specified.

Further, PTL 2 discloses a failure diagnosis method using an infrared camera.

CITATION LIST

Patent Literature

PTL 1: Japanese Unexamined Patent Application Publication No. 06-207914 (publication date: Jul. 26, 1994)
PTL 2: Japanese Unexamined Patent Application Publication No. 04-348266 (publication date: Dec. 3, 1992)

SUMMARY OF INVENTION

Technical Problem

However, in the case of a low-heat-generation fault in which a sufficient change in temperature is not obtained, there is a probability that use of the techniques according to PTL 1 and PTL 2 does not enable generation of a distinct difference in contrast in a difference image representing the difference between an infrared image of a faulty portion (a wiring portion in which heat is generated) and an infrared image of a background portion (a wiring portion in which heat is not generated and a portion other than the wiring portion on the substrate). In this case, even if the difference image is binarized, it is impossible to sufficiently separate the faulty portion and the background portion from each other, and it is difficult to specify the faulty portion.

The present invention has been made in view of the above-described problem, and an object of the invention is to provide a method and apparatus that are capable of detecting a faulty portion on a substrate with high accuracy regardless of the amount of heat generation in the faulty portion (the intensity of an infrared image) by setting thresholds for a time period (the number of frames) until heat is generated in a semiconductor substrate (leak fault substrate) and a temperature rise value, and to provide a method for manufacturing the substrate.

Solution to Problem

To solve the above-described problem, a wiring fault detection method according to the present invention includes:
a voltage application step of applying a predetermined voltage to a wiring line formed on a semiconductor substrate;
a measurement step of continuously measuring, for a certain time period, a temperature of a region of at least a part of the semiconductor substrate to which a voltage is applied in the voltage application step, by using an infrared camera;
a judgment step of judging whether or not a temperature rise value, which is derived by subtracting a temperature value of the semiconductor substrate before the voltage is applied from a temperature value measured in the measurement step, is larger than or equal to a threshold; and
a fault determination step of determining that the wiring line formed in the region has a short-circuit fault in a case where it is judged in the judgment step that the temperature rise value is larger than or equal to the threshold, and determining that the wiring line does not have a short-circuit fault in a case where it is judged that the temperature rise value is smaller than the threshold.

According to the above-described configuration, even in the case of a fault that is difficult to be detected by using a fault detection method using a difference image of infrared images because change in temperature is insufficient due to low heat generation in the fault, the fault can be detected with high accuracy by performing judgment using numeric data of temperature rise values or the like without using an infrared image that is visually perceived. In other words, a fault caused by a short circuit on a semiconductor substrate can be detected with high accuracy regardless of the amount of heat generation (intensity of an infrared image) of the fault.

To solve the above-described problem, a wiring fault detection apparatus according to the present invention includes:
voltage application means for applying a predetermined voltage to a wiring line formed on a semiconductor substrate;
an infrared camera for measuring a temperature of the semiconductor substrate;
measurement means for continuously measuring, for a certain time period, the temperature of the semiconductor substrate using the infrared camera;
judgment means for deriving a temperature rise value by subtracting a temperature value of the semiconductor substrate before the voltage is applied from a temperature value acquired by the measurement means, and judging whether or not the derived temperature rise value is larger than or equal to a threshold; and fault determination means for determining that the wiring line has a short-circuit fault in a case where the judgment means judges that the temperature rise value is larger than or equal to the threshold, and determining that the wiring line does not have the short-circuit fault in a case where the judgment means judges that the temperature rise value is smaller than the threshold, wherein the measurement means, the judgment means, and the fault determination means are provided in a control unit.

According to the above-described configuration, even in the case of a fault that is difficult to be detected by using a fault detection method using a difference image of infrared images because change in temperature is insufficient due to low heat generation in the fault, the fault can be detected with high accuracy by performing judgment using numeric data of temperature rise values or the like without using an infrared image that is visually perceived. In other words, a fault can be detected with high accuracy regardless of the amount of heat generation (intensity of an infrared image) of a faulty portion.

A method for manufacturing a semiconductor substrate according to the present invention includes:

a semiconductor substrate formation step of forming, on a substrate, at least one of a gate electrode, a source electrode, and a drain electrode, a wiring line connected thereto, and a semiconductor film, so as to form a semiconductor substrate on which the wiring line is formed;

a voltage application step of applying a predetermined voltage to the wiring line formed on the semiconductor substrate;

a measurement step of continuously measuring, for a certain time period, a temperature of a region of at least a part of the semiconductor substrate to which a voltage is applied in the voltage application step, by using an infrared camera;

a judgment step of judging whether or not a temperature rise value, which is derived by subtracting a temperature value of the semiconductor substrate before the voltage is applied from a temperature value measured in the measurement step, is larger than or equal to a threshold; and a fault determination step of determining that the wiring line formed in the region has a short-circuit fault in a case where it is judged in the judgment step that the temperature rise value is larger than or equal to the threshold, and determining that the wiring line does not have a short-circuit fault in a case where it is judged that the temperature rise value is smaller than the threshold.

Advantageous Effects of Invention

As described above, with the wiring fault detection method and wiring fault detection apparatus according to the present invention, even in the case of a fault that is difficult to be detected by using a fault detection method using a difference image of infrared images because change in temperature is insufficient due to low heat generation in the fault, a faulty portion on a substrate can be detected with high accuracy by performing judgment using numeric data of temperature rise values or the like without using an infrared image that is visually perceived. In other words, a faulty portion on a semiconductor substrate can be detected with high accuracy regardless of the amount of heat generation (intensity of an infrared image) of a faulty portion.

DESCRIPTION OF EMBODIMENTS

An embodiment of a wiring fault detection apparatus and a wiring fault detection method according to the present invention will be described with reference to FIGS. 1 to 8.

(1) Configuration of Wiring Fault Detection Apparatus

Figure 1:
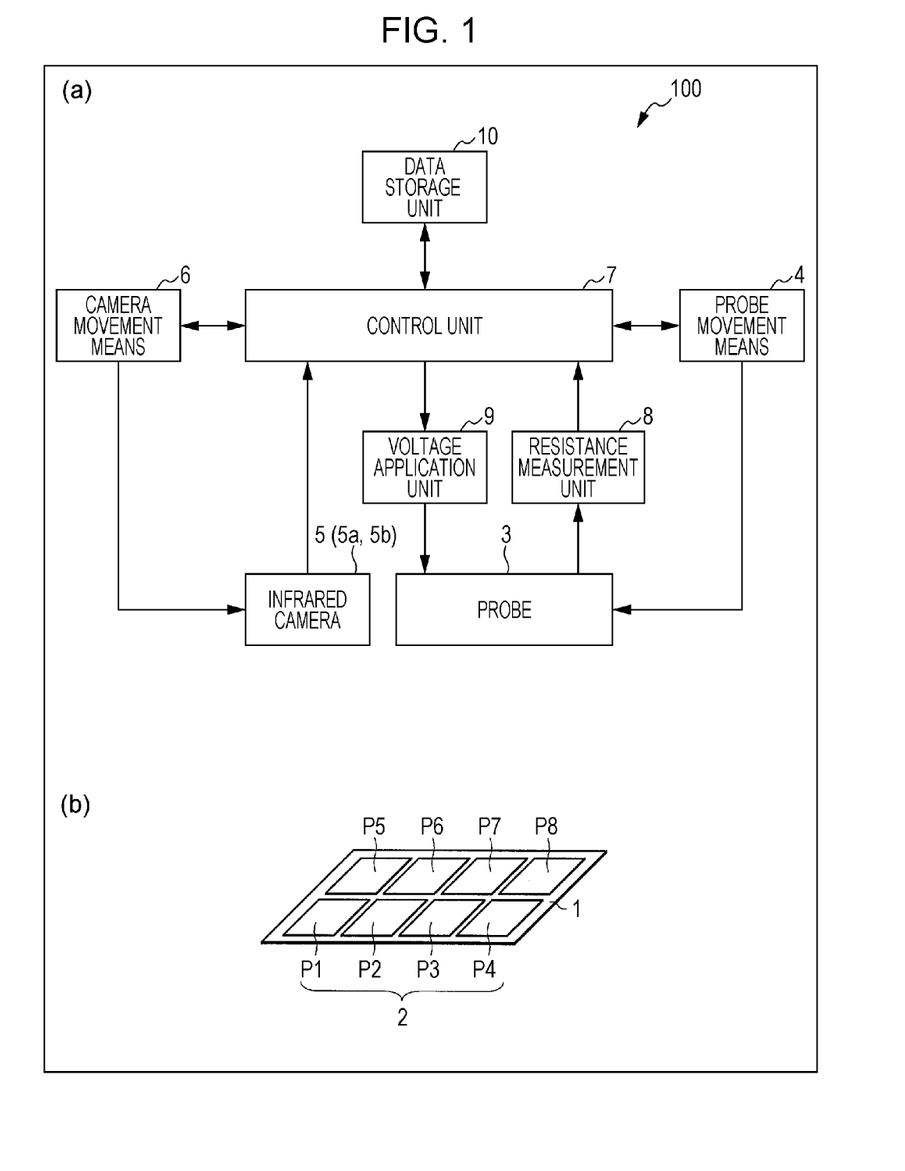
FIG. 1 includes a block diagram illustrating the configuration of a wiring fault detection apparatus according to an embodiment of the present invention, and a perspective view illustrating the configuration of a mother substrate provided with liquid crystal panels.

Part (a) of FIG. 1 is a block diagram illustrating the configuration of a wiring fault detection apparatus 100 according to this embodiment, and part (b) of FIG. 1 is a perspective view of a mother substrate 1 (semiconductor substrate), which is a target in which a wiring fault is to be detected using the wiring fault detection apparatus 100.

The wiring fault detection apparatus 100 is capable of detecting a fault of a wiring line and so forth in a plurality of liquid crystal panels 2 (semiconductor substrates) formed on the mother substrate 1 illustrated in part (b) of FIG. 1. For this purpose, the wiring fault detection apparatus 100 includes, as illustrated in part (a) of FIG. 1, a probe 3 to be electrically connected to the liquid crystal panels 2, and probe movement means 4 for moving the probe 3 onto the individual liquid crystal panels 2. Also, the wiring fault detection apparatus 100 includes an infrared camera 5 for capturing an infrared image, and camera movement means 6 for moving the infrared camera 5 above the liquid crystal panels 2. Further, the wiring fault detection apparatus 100 includes a control unit 7 for controlling the probe movement means 4 and the camera movement means 6 (measurement means, judgment means, and fault determination means).

A resistance measurement unit 8 for measuring a resistance between wiring lines of the liquid crystal panels 2, and a voltage application unit 9 (voltage application means) for applying a voltage between wiring lines of the liquid crystal panels 2 are connected to the probe 3. The resistance measurement unit 8 and the voltage application unit 9 are controlled by the control unit 7.

The control unit 7 is connected to a data storage unit 10 that stores resistance values between wiring lines and image data.

Figure 2:
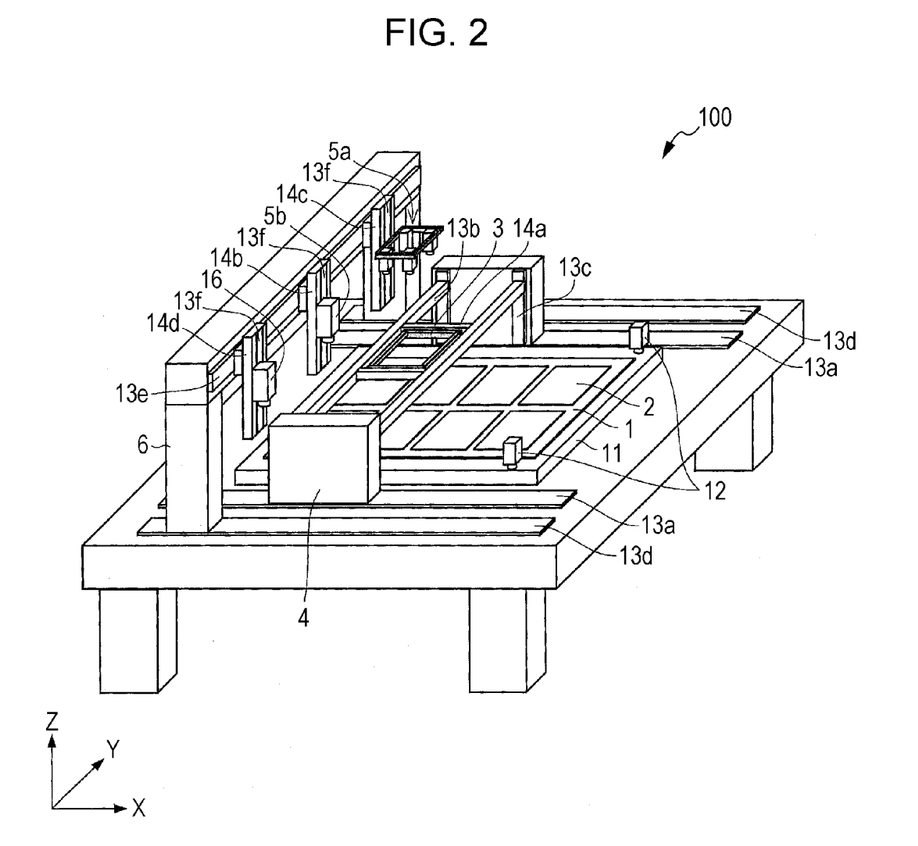
FIG. 2 is a perspective view illustrating the configuration of the wiring fault detection apparatus according to the embodiment of the present invention.

FIG. 2 is a perspective view illustrating the configuration of the wiring fault detection apparatus 100 according to this embodiment. As illustrated in FIG. 2, the wiring fault detection apparatus 100 includes an alignment stage 11 disposed on a base plate, and is configured so that the mother substrate 1 can be disposed on the alignment stage 11. The alignment stage 11 on which the mother substrate 1 is disposed is aligned in parallel with the X and Y coordinate axes of the probe movement means 4 and the camera movement means 6. In this case, to align the alignment stage 11, optical cameras 12 that are provided above the alignment stage 11 and are used to check the position of the mother substrate 1 are used.

The probe movement means 4 is slidably disposed on guide rails 13a that are disposed on the outer sides of the alignment stage 11. Also, guide rails 13b and 13c are disposed on the main body side of the probe movement means 4, and a mount portion 14a is disposed so as to be movable in the individual coordinate directions of X, Y, and Z along these guide rails 13. The probe 3 compatible with the liquid crystal panels 2 is mounted on the mount portion 14a.

The camera movement means 6 is slidably disposed on guide rails 13d that are disposed on the outer sides of the probe movement means 4. Also, guide rails 13e and 13f are disposed on the main body of the camera movement means 6. Three mount portions 14b, 14c, and 14d are capable of separately moving in the individual coordinate directions of X, Y, and Z along these guide rails 13.

In this embodiment, the infrared camera 5 provided in the wiring fault detection apparatus 100 includes two types of cameras. One is an infrared camera 5a for macro measurement, and the other is an infrared camera 5b for micro measurement.

The infrared camera 5a for macro measurement is mounted on the mount portion 14c of the wiring fault detection apparatus 100, the infrared camera 5b for micro measurement is mounted on the mount portion 14b, and an optical camera 16 is mounted on the mount portion 14d.

The infrared camera 5a for macro measurement is an infrared camera that has a field of view of about 520×405 mm and that is capable of performing macro measurement. To increase the field of view, the infrared camera 5a for macro measurement is configured by combining four infrared cameras. That is, the field of view of each infrared camera for macro measurement is about a quarter of the mother substrate 1.

The infrared camera 5b for micro measurement is an infrared camera that has a small field of view of about 32×24 mm and that is capable of performing micro measurement in which high-resolution image capturing can be performed.

Additionally, a laser irradiation device for correcting a faulty portion can be mounted on the camera movement means 6 by adding a mount portion. In a case where the laser irradiation device is mounted, the position of a faulty portion can be specified and then the fault can be corrected by irradiating the faulty portion with laser light in a sequential manner.

The probe movement means 4 and the camera movement means 6 are disposed on the different guide rails 13a and 13d, and thus can be moved in the X coordinate direction above the alignment stage 11 without interfering with each other. Accordingly, the infrared cameras 5a and 5b and the optical camera 16 can be moved to a position above a liquid crystal panel 2 in a state where the probe 3 is in contact with the liquid crystal panel 2.

Figure 3:
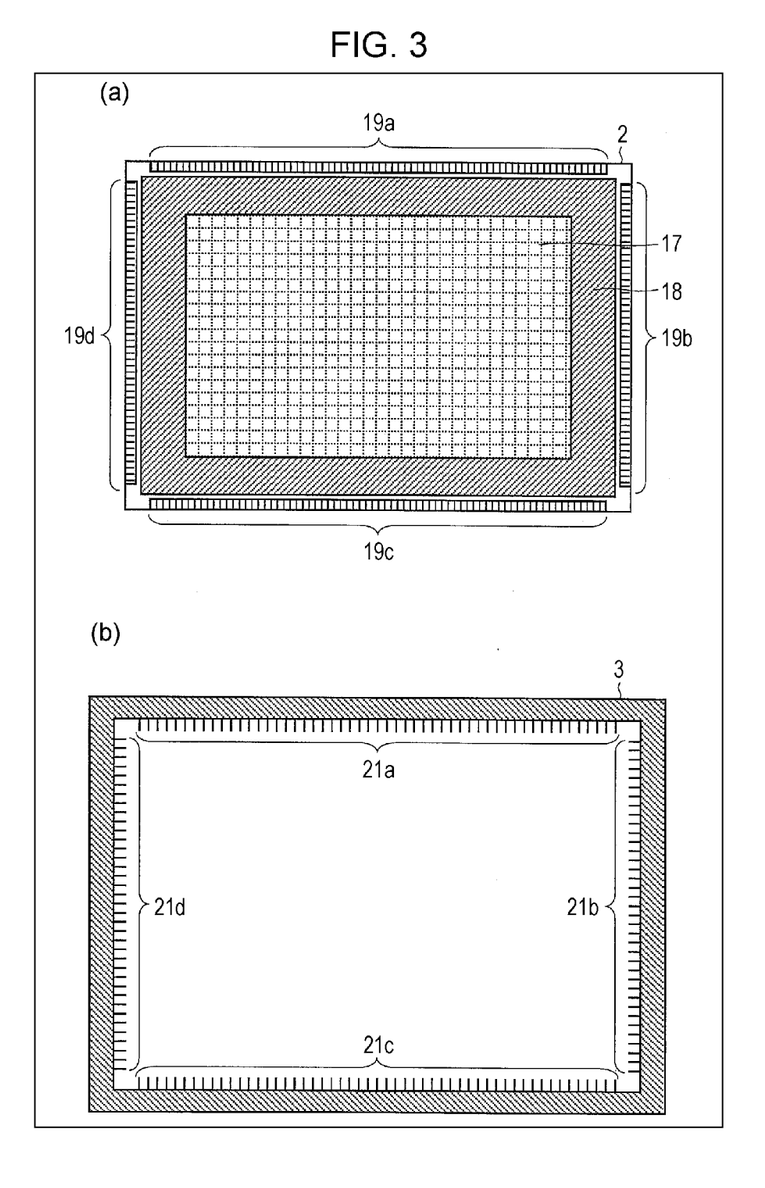
FIG. 3 includes plan views of a liquid crystal panel and a probe according to the embodiment of the present invention.

Part (a) of FIG. 3 is a plan view of one liquid crystal panel 2 among the plurality of liquid crystal panels 2 formed on the mother substrate 1. As illustrated in part (a) of FIG. 3, a pixel portion 17 in which TFTs are formed at individual intersections where scanning lines and signal lines cross each other, and a drive circuit portion 18 for driving the scanning lines and the signal lines are formed on each liquid crystal panel 2. Terminal portions 19a to 19d are disposed at edge portions of the liquid crystal panel 2. The terminal portions 19a to 19d are connected to wiring lines of the pixel portion 17 or the drive circuit portion 18.

The liquid crystal panel 2 is fabricated by forming gate electrodes, a semiconductor film, source electrodes, drain electrodes, a protection film, and transparent electrodes on a transparent substrate. Hereinafter, an example of a specific method for manufacturing the liquid crystal panel 2 will be described.

First, metal films such as a titanium film, an aluminum film, and a titanium film are sequentially formed on an entire transparent substrate using a sputtering method. After that, patterning is performed using photolithography, and gate wiring lines, gate electrodes, and capacity wiring lines having a thickness of, for example, about 4000 Å are formed.

Subsequently, a silicon nitride film or the like is formed on the entire substrate on which the gate wiring lines, the gate electrodes, and the capacity wiring lines have been formed, by using, for example, a plasma CVD (Chemical Vapor Deposition) method, and a gate insulating film having a thickness of about 4000 Å is formed.

Further, an intrinsic amorphous silicon film and a phosphorus-doped n+ amorphous silicon film are sequentially formed, using the plasma CVD method, on the entire substrate on which the gate insulating film has been formed. After that, these silicon films are patterned into an island shape on the gate electrodes by using photolithography, so that a semiconductor film is formed in which the intrinsic amorphous silicon layer having a thickness of about 2000 Å and the n+ amorphous silicon layer having a thickness of about 500 Å are stacked.

Subsequently, an aluminum film, a titanium film, and so forth are formed using the sputtering method on the entire substrate on which the semiconductor film has been formed, and patterning is performed using photolithography, so that source wiring lines, source electrodes, conductive films, and drain electrodes each having a thickness of about 2000 Å are formed.

Subsequently, the n+ amorphous silicon layer of the semiconductor film is etched using the source electrodes and the drain electrodes as a mask, and thereby a channel portion is patterned and TFTs are formed.

Further, for example, an acrylic photosensitive resin is applied using a spin coat method on the entire substrate on which the TFTs have been formed, and the applied photosensitive resin is exposed via a photo mask. After that, the exposed photosensitive resin is developed, so that an interlayer insulating film having a thickness of about 2 to 3 μm is formed on the drain electrodes. Subsequently, contact holes for individual pixels are formed in the interlayer insulating film.

Subsequently, an ITO film is formed on the entire substrate on the interlayer insulating film by using the sputtering method. After that, patterning is performed using photolithography, and transparent electrodes having a thickness of about 1000 Å are formed.

In this way, the liquid crystal panel 2 (semiconductor substrate) can be formed.

The above-described example of the manufacturing method is applicable to the mother substrate 1 (semiconductor substrate). By using a large transparent substrate, gate electrodes and so forth are formed in a region where a plurality of (for example, in part (b) of FIG. 1, eight) liquid crystal panels are to be formed by applying the above-described steps. After transparent electrodes have been formed, a wiring fault test method described below is performed. If a fault is detected, the fault is corrected, and a good product with no faults is manufactured by implementing the wiring fault test method again if necessary. A product in which no faults are detected is regarded as a good product at the time. After that, for example, each liquid crystal panel is separated from the mother board, and manufacturing of each liquid crystal panel as a single liquid crystal panel can be completed. A fault may be corrected by, for example, irradiating the faulty portion with laser light to cut a short-circuit portion, and another method may be used.

Part (b) of FIG. 3 is a plan view of the probe 3 (voltage application means) that is to be electrically connected to the terminal portions 19a to 19d disposed on the liquid crystal panel 2. The probe 3 has a frame shape, the size of which is almost the same as that of the liquid crystal panel 2 illustrated in part (a) of FIG. 3, and includes a plurality of probe pins 21a to 21d corresponding to the terminal portions 19a to 19d disposed on the liquid crystal panel 2.

Regarding the plurality of probe pins 21a to 21d, the probe pins 21 can be individually connected to the resistance measurement unit 8 and the voltage application unit 9 illustrated in part (a) of FIG. 1 via a switching relay (not illustrated). Thus, in the probe 3, a plurality of wiring lines leading to the terminal portions 19a to 19d can be selectively connected, or a plurality of wiring lines can be collectively connected.

The probe 3 has a shape of a frame, the size of which is almost the same as that of the liquid crystal panel 2. Thus, in the case of adjusting the positions of the terminal portions 19a to 19d and the probe pins 21a to 21d, the positions can be checked using the optical camera 16 from the inner side of the frame of the probe 3.

As described above, the wiring fault detection apparatus 100 according to this embodiment includes the probe 3 and the resistance measurement unit 8 connected to the probe 3, and is capable of measuring a resistance value of each wiring line and a resistance value between adjacent wiring lines described below, by electrically connecting the probe 3 to the liquid crystal panel 2.

The wiring fault detection apparatus 100 according to this embodiment also includes the probe 3, the voltage application unit 9 connected to the probe 3, and the infrared camera 5. Before and after applying a voltage to wiring lines or between wiring lines of the liquid crystal panel 2 via the probe 3, the wiring fault detection apparatus 100 measures the temperature of the liquid crystal panel 2 by using the infrared camera 5.

Specifically, before and after applying a voltage, the wiring fault detection apparatus 100 captures a moving image of the liquid crystal panel 2 by using the infrared camera 5. The moving image obtained through capturing is stored in the data storage unit 10.

The moving image stored in the data storage unit 10 undergoes data processing in the control unit 7, and temperature values of individual pixels are calculated. The temperature values are also stored in the data storage unit 10.

Further, the control unit 7 calculates a difference image using an image before voltage application and an image after voltage application stored in the data storage unit 10, and calculates, for individual pixels of the imaged data, temperature rise values based on heat generation caused by voltage application. Hereinafter, the "pixels of imaged data" are referred to as "data pixels". In a case where a calculated temperature rise value exceeds a preset temperature rise threshold within a preset time period (the number of frames) threshold, it is determined that the corresponding data pixel has a fault. That is, it is determined that the data pixel is a faulty portion. The preset time period (the number of frames) threshold and the preset temperature rise threshold will be described below.

Hereinafter, a detailed description will be given of fault detection that is performed using the wiring fault detection apparatus 100 having the above-described configuration according to this embodiment.

In particular, in the wiring fault detection apparatus 100 according to this embodiment, a resistance test and infrared detection can be performed by the single apparatus.

(2) Wiring Fault Detection Method

Figure 4:
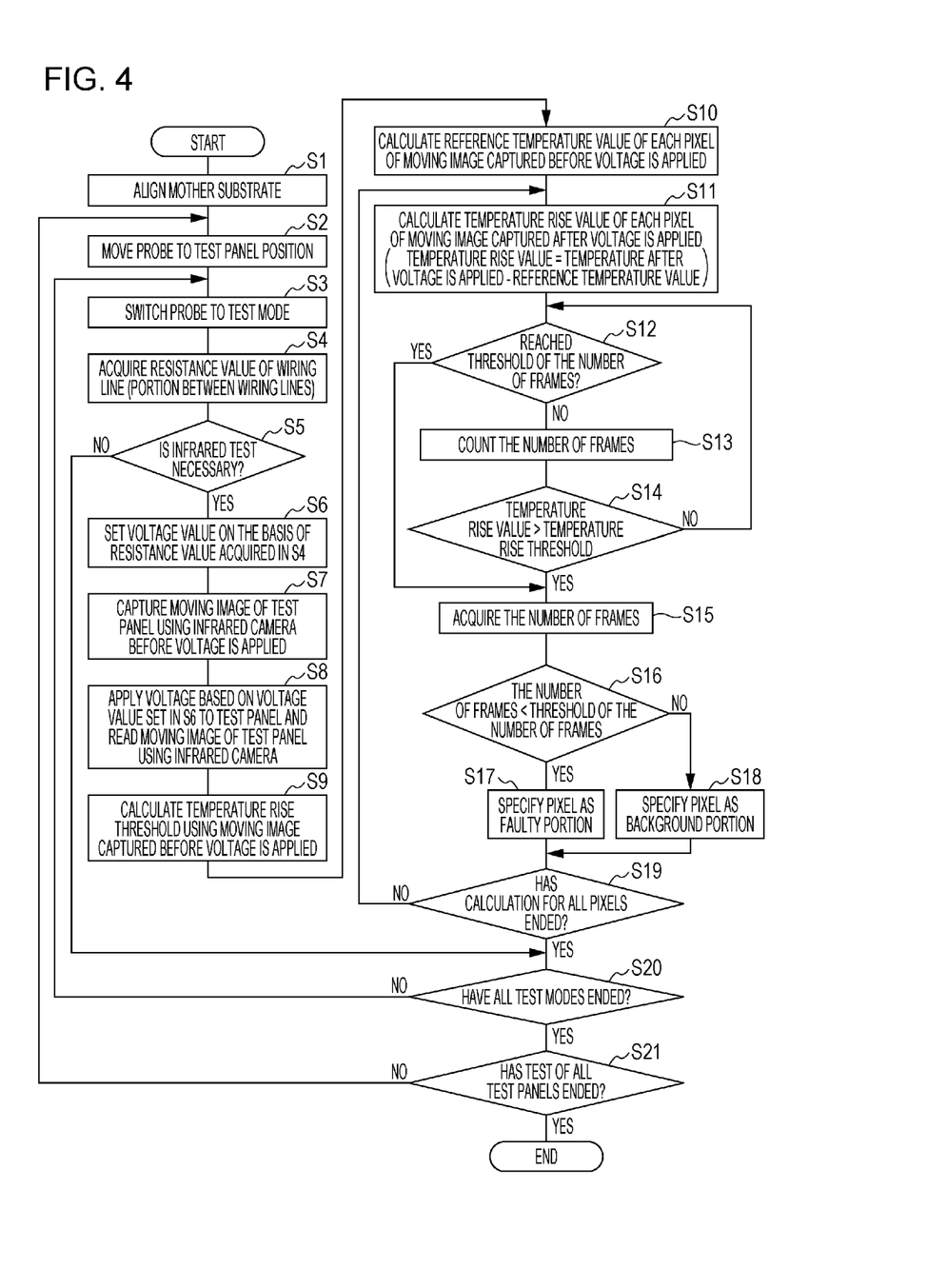
FIG. 4 is a flowchart illustrating a wiring fault detection method according to the embodiment of the present invention.

FIG. 4 is a flowchart of a wiring fault detection method using the wiring fault detection apparatus 100 according to this embodiment.

In the wiring fault detection method according to this embodiment, wiring fault detection is sequentially performed on the plurality of liquid crystal panels 2 formed on the mother substrate 1 illustrated in part (b) of FIG. 1, in steps S1 to S21.

The wiring fault detection method according to this embodiment includes:

(i) a voltage application step of applying a predetermined voltage to a wiring line formed on a liquid crystal panel 2;

(ii) a measurement step of continuously measuring, for a certain time period, a temperature of a region of at least a part of the liquid crystal panel 2 to which a voltage is applied in the voltage application step, by using the infrared camera 5;

(iii) a judgment step of judging whether or not a temperature rise value, which is derived by subtracting a temperature value of the liquid crystal panel 2 before the voltage is applied from a temperature value measured in the measurement step, is larger than or equal to a threshold; and (iv) a fault determination step of determining that the wiring line formed in the region has a short-circuit fault in a case where it is judged in the judgment step that the temperature rise value is larger than or equal to the threshold, and determining that the wiring line does not have a short-circuit fault in a case where it is judged that the temperature rise value is smaller than the threshold.

Hereinafter, individual steps S1 to S21 will be described.

In step S1, the mother substrate 1 is placed on the alignment stage 11 of the wiring fault detection apparatus 100 illustrated in FIG. 2, and the substrate is aligned so as to be parallel with the X and Y coordinate axes.

In step S2, the probe 3 is moved by the probe movement means 4 illustrated in FIG. 2 to a position above the liquid crystal panel 2 as a detection target on the mother substrate 1 that is aligned in step S1, and the probe pins 21a to 21d come into contact with the terminal portions 19a to 19d of the liquid crystal panel 2.

In step S3, after step S2, a wiring line or a portion between wiring lines as a target of a resistance test is selected in accordance with detection modes for various types of fault, and switching of the probe pins 21 to be brought into conduction is performed.

Now, detection modes for various types of fault will be described with reference to part (a) to (c) of FIG. 5. In part (a) to (c) of FIG. 5, the positions of faulty portions 23 (wiring short-circuit portions) generated in the pixel portion 17 are schematically illustrated as an example.

Figure 5:
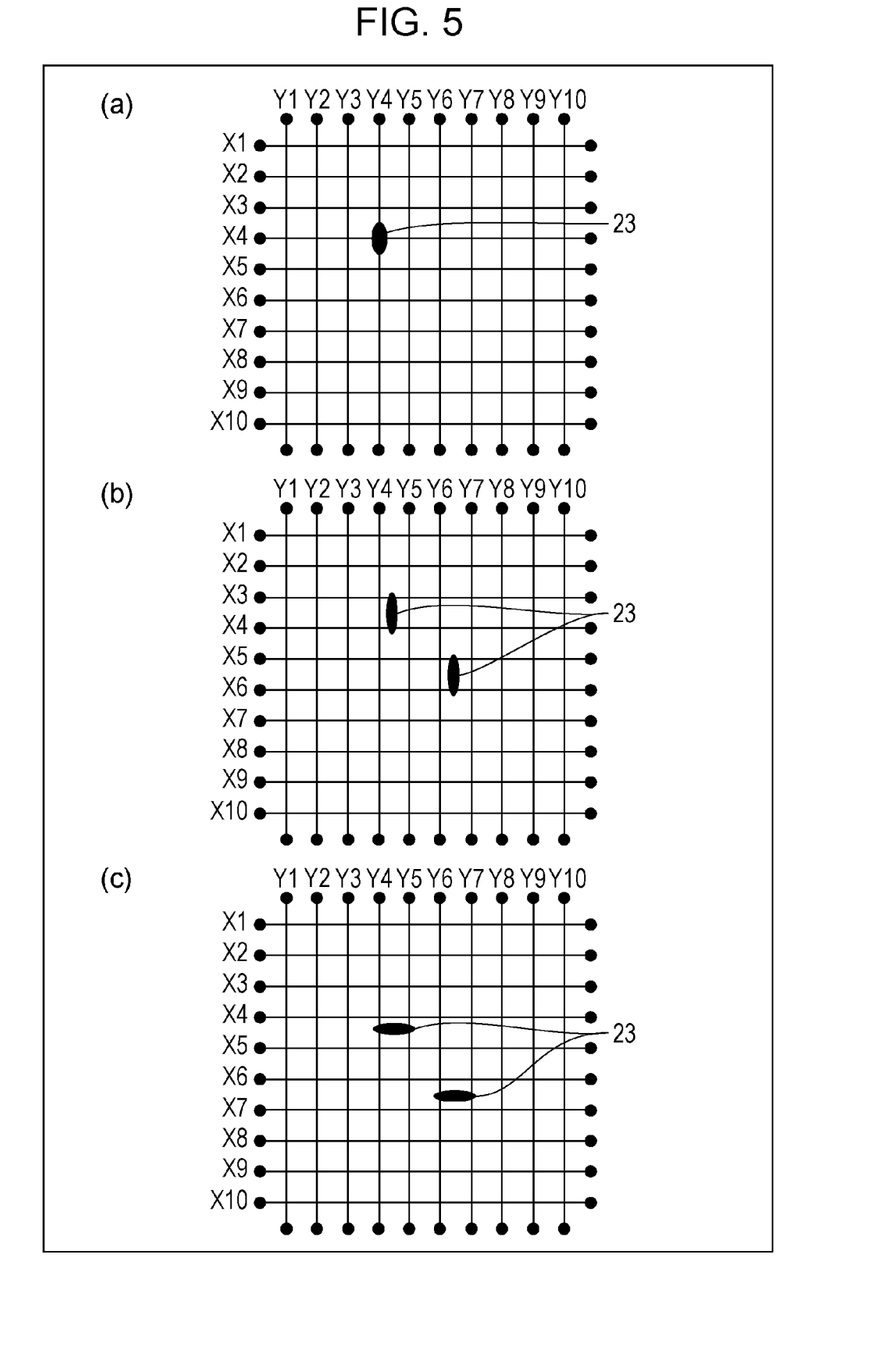
FIG. 5 includes schematic diagrams illustrating faults in a pixel portion according to the embodiment of the present invention.

Part (a) of FIG. 5 illustrates a faulty portion 23 in which a wiring line X and a wiring line Y are short-circuited at an intersection portion in the liquid crystal panel where wiring lines X and wiring lines Y extend in the horizontal and vertical directions to intersect each other, for example, like scanning lines and signal lines. The probe pins 21 to be brought into conduction are switched to a pair of 21a and 21d or a pair of 21b and 21c illustrated in FIG. 3, and resistance values between wiring lines are measured regarding wiring lines X1 to X10 and wiring lines Y1 to Y10 in a one-to-one relationship. Accordingly, the presence/absence of the faulty portion 23 can be specified.

Part (b) of FIG. 5 illustrates faulty portions 23 in which wiring lines X adjacent to each other, for example, a scanning line and an auxiliary capacitance line, are short-circuited. In this case, the wiring line having such a faulty portion 23 can be specified by switching the probe pins 21 to be brought into conduction to a pair of an odd-numbered pin of 21b and an even-numbered pin of 21d and by measuring the resistance values between wiring lines adjacent to each other among the wiring lines X1 to X10.

Part (c) of FIG. 5 illustrates faulty portions 23 in which wiring lines Y adjacent to each other, for example, a scanning line and an auxiliary capacitance line, are short-circuited. In this case, the wiring line having such a faulty portion 23 can be specified by switching the probe pins 21 to be brought into conduction to a pair of an odd-numbered pin of 21a and an even-numbered pin of 21c and by measuring the resistance values between wiring lines adjacent to each other among the wiring lines Y1 to Y10.

In step S4, the probe pins 21 switched in step S3 are brought into conduction, and the resistance value of a selected wiring line or a portion between selected wiring lines is measured and acquired. The acquired resistance value is stored in the data storage unit 10.

In step S5, the resistance value acquired in step S4 is compared with a resistance value of a wiring line or a portion between wiring lines of a non-defective panel (reference panel) stored in the data storage unit 10 in advance. Here, in a case where the resistance value acquired in step S4 is equal to the resistance value of the wiring line or the portion between the wiring lines of the non-defective panel stored in the data storage unit 10 in advance, the process proceeds to step S20. In a case where the resistance value acquired in step S4 is equal to the resistance value of the wiring line or the portion between the wiring lines of the non-defective panel, it can be specified that no faults exist in this detection mode.

On the other hand, in step S5, in a case where the resistance value acquired in step S4 is not equal to the resistance value of the wiring line or the portion between the wiring lines of the non-defective panel stored in the data storage unit 10 in advance, the process proceeds to step S6. In a case where the resistance value acquired in step S4 is not equal to the resistance value of the wiring line or the portion between the wiring lines of the non-defective panel stored in the data storage unit 10 in advance, it can be specified that there is a probability that a fault exists in the wiring line or the portion between the wiring lines in this detection mode. In a case where there is a probability that a fault exists, it is necessary to perform infrared detection.

For example, as illustrated in part (a) of FIG. 5, in a case where a faulty portion 23 exists at a portion where a wiring line X and a wiring line Y intersect each other, an abnormality is detected in the wiring line X4 and the wiring line Y4 in the test of resistance between the wiring lines, and thus the position of the faulty portion 23 can be specified. Thus, in the case of the faulty portion 23 illustrated in part (a) of FIG. 5, it is not always necessary to specify the position thereof through infrared detection (step S6). That is, if a resistance test is performed for each of all the pairs of the wiring lines X and the wiring lines Y, the position can also be specified, and infrared detection is not necessary. However, the number of pairs is enormous, and long time is taken. For example, in the case of a full high-definition liquid crystal panel, the number of wiring lines X is 1080 and the number of wiring lines Y is 1920, and thus the number of all the pairs is about 2.07 million. If a resistance test is performed for each of such pairs, a takt-time becomes long and detection processing ability significantly decreases, which is not practical. The number of resistance tests can be reduced by collectively performing a resistance test by grouping all the pairs of wiring lines X and wiring lines Y into some groups. For example, if a resistance test is performed on a group of the wiring lines X and a group of the wiring lines Y, the number of resistance tests is only one. However, a resistance test enables detection of a short circuit between wiring lines but does not enable specification of the position thereof. Thus, it is necessary to specify the position of the faulty portion 23 through infrared detection.

On the other hand, as in part (b) or (c) of FIG. 5, in a case where a faulty portion 23 is generated between wiring lines adjacent to each other, it can be specified that a faulty portion exists between a pair of wiring lines, for example, between the wiring line X3 and the wiring line X4. However, in the length direction of the wiring lines, the position of the faulty portion 23 cannot be specified, and thus it is necessary to specify the position of the faulty portion 23 through infrared detection.

The number of resistance tests performed between wiring lines adjacent to each other is enormous, which takes long time. For example, in the case of a full high-definition liquid crystal panel, the number of resistance tests performed between wiring lines X adjacent to each other is 1079, and the number of resistance tests performed between wiring lines Y adjacent to each other is 1919. In the case of a resistance test performed between wiring lines X adjacent to each other as in the case of part (b) of FIG. 5, the number of resistance tests is only one if a resistance test is performed between all the odd-numbered wiring lines X and all the even-numbered wiring lines X. In the case of a resistance test performed between wiring lines Y adjacent to each other as in the case of part (c) of FIG. 5, the number of resistance tests is only one if a resistance test is performed between all the odd-numbered wiring lines Y and all the even-numbered wiring lines Y. However, a resistance test enables detection of a short circuit between wiring lines, but does not enable specification of the position thereof. Thus, it is necessary to specify the position of the faulty portion 23 through infrared detection.

Thus, in step S6 (voltage application step), a voltage value to be applied to a wiring line of the liquid crystal panel 2 in infrared detection is set on the basis of the resistance value stored in the data storage unit 10 in step S4.

Specifically, in step S6 (voltage application step), an application voltage V (volt) proportional to the square root of the resistance value acquired in step S4 is applied to the liquid crystal panel 2. That is, in step S6, the following equation (1);

[Math. 1]

$$V = k \times \sqrt{(R)} \tag{1}$$

in which k represents a constant and R represents a resistance value (ohm), is set, which expresses the application voltage V (volt).

Here, the amount of heat generation J (joule) per unit time is represented by the following equation (2);

[Math. 2]

$$J = W \times T = W = V \times I = I^2 \times R = V^2/R \quad (2),$$

in which W represents power consumption (watt), T represents time (second), and I represents current (ampere).

Thus, the amount of heat generation J per unit time is expressed by the following equation (3);

[Math. 3]

$$J = V^2/R = [k \times \sqrt{(R)}]^2/R = k^2 = \text{constant} \quad (3)$$

on the basis of equations (1) and (2) given above.

That is, the application voltage V (volt) proportional to the square root of the resistance value is applied to the liquid crystal panel 2 on the basis of equation (1), and thereby the amount of heat generation per unit time can be made constant. Therefore, the resistance value of a short-circuit path including a faulty portion 23 significantly fluctuates due to a short-circuit cause, such as the type of substrate or a location where the faulty portion 23 is generated on the substrate, but the amount of heat generation per unit time can be made constant by performing step S6 according to this embodiment.

In step S7 (measurement step), before the voltage based on the voltage value set in step S6 is applied to the liquid crystal panel 2, a moving image of the liquid crystal panel 2 in which heat is not generated is read using the infrared camera 5. Specifically, the control unit 7 illustrated in FIG. 1 measures, using the infrared camera 5, the temperature of the liquid crystal panel 2 in which heat is not generated, reads image data including data of the measured temperature value into a computer memory, and stores the image data in the data storage unit 10.

In step S8 (voltage application step, measurement step), the voltage based on the voltage value set in step S6 is first applied to the liquid crystal panel 2. Subsequently, using the infrared camera 5, a moving image of the liquid crystal panel 2 in which heat is generated after the voltage is applied is read. Specifically, the control unit 7 illustrated in FIG. 1 measures, using the infrared camera 5, the temperature value of the liquid crystal panel 2 in which heat is generated, reads image data including data of the measured temperature value into a computer memory, and stores the image data in the data storage unit 10. Here, the application voltage is adjusted by the control unit 7 by controlling the voltage application unit 9.

In step S9 (judgment step), the control unit 7 calculates a temperature rise threshold using the moving image that is captured before voltage is applied and that is read in step S7. Now, a method for calculating a temperature rise threshold according to this embodiment will be described with reference to FIG. 6.

Figure 6:
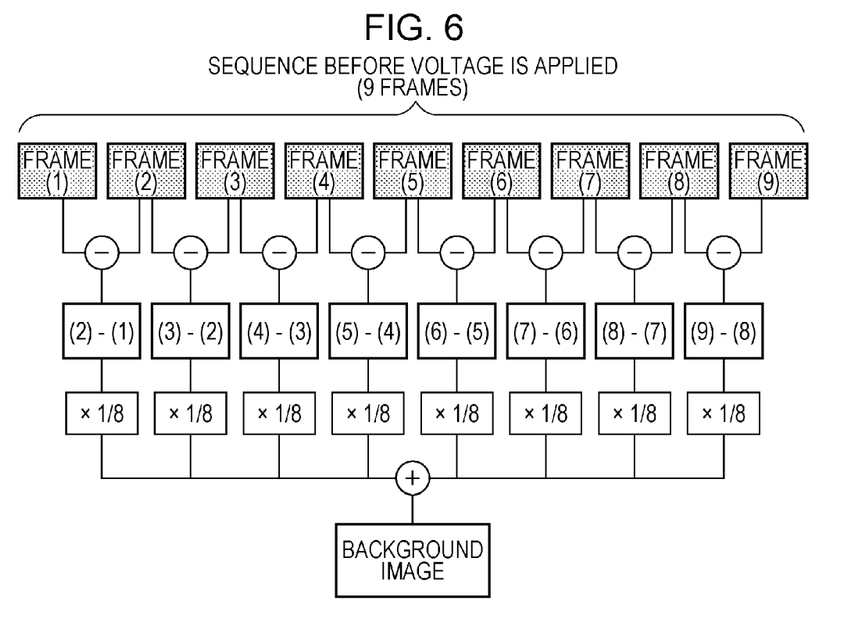
FIG. 6 is a schematic diagram of a method for crating a background image in the case of calculating a temperature rise threshold according to the embodiment of the present invention.

The temperature rise threshold is set, as expressed by the following equation (4), by creating a background image (with a sign (not an absolute value)) by calculating the differences between frames adjacent to each other of a moving image (corresponding to nine frames) of the liquid crystal panel 2 in which heat is not generated before voltage is applied and integrating and averaging the differences, and using the average value and standard deviation of the histogram of this background image;

[Math. 4]

$$\text{Temperature rise threshold} = \text{average value} + n \times \text{standard deviation} \quad (4),$$

in which n represents an integer value designated by the user, as illustrated in FIG. 6.

For example, if n is set to be large, the temperature rise threshold becomes large in accordance with equation (4), and thus background noise can be reduced. In this embodiment, a temperature rise threshold is calculated by setting n to 4, and the temperature rise threshold is set to about 0.1 ($\Delta K$).

However, in the present invention, n is not limited to 4 in equation (4).

In step S10 (judgment step), the control unit 7 calculates the reference temperature value of each data pixel of the moving image of the liquid crystal panel 2 in which heat is not generated before voltage is applied, the moving image being read in step S7. Here, a reference temperature value is a temperature value corresponding to the background image created using the method illustrated in FIG. 6.

In step S11 (judgment step), the control unit 7 calculates the temperature rise value of each data pixel of the moving image of the liquid crystal panel 2 in which heat is generated after voltage is applied, the moving image being read in step S8. A temperature rise value is calculated using the following equation (5);

[Math. 5]

$$\text{Temperature rise value} = \text{temperature after voltage is applied} - \text{reference temperature value} \quad (5)$$

in this case.

In step S12 (fault determination step), it is determined whether or not the time period after voltage is applied to the liquid crystal panel 2, that is, the number of frames, has reached a threshold of the number of frames. Here, if it is determined that the number of frames after voltage is applied to the liquid crystal panel 2 has reached the threshold of the number of frames, the process proceeds to step S15, in which the number of frames at this time is acquired. On the other hand, if it is determined that the number of frames after voltage is applied to the liquid crystal panel 2 has not reached the threshold of the number of frames, the process proceeds to step S13, in which the number of frames is counted.

In step S13 (fault determination step), the number of frames after measurement of the temperature of the liquid crystal panel 2 is started by the infrared camera 5 after voltage is applied is counted.

In step S14 (fault determination step), it is determined whether or not the temperature rise value exceeds the preset temperature rise threshold. Here, in a case where it is determined that the temperature rise value is larger than the temperature rise threshold, the process proceeds to step S15, in which the number of frames at this time is acquired. On the other hand, in a case where it is determined that the temperature rise value is smaller than or equal to the temperature rise threshold, the process returns to step S12, in which it is determined again whether or not the number of frames after voltage is applied to the liquid crystal panel 2 has reached the threshold of the number of frames.

In step S15 (fault determination step), the number of frames counted in step S13 is acquired.

In step S16 (fault determination step), it is determined whether or not the number of frames acquired in step S15 is smaller than the preset threshold of the number of frames. Here, in a case where the number of frames acquired in step S15 is smaller than the present threshold of the number of frames, the process proceeds to the next step S17 (fault determination step), in which it is determined that the corresponding data pixel includes a fault. That is, it is specified that the corresponding data pixel is a faulty portion. On the other hand, in a case where the number of frames acquired in step S15 is larger than or equal to the preset threshold of the number of frames, the process proceeds to step S18 (fault determination step), in which it is determined that the corresponding data pixel does not include a fault. That is, it is specified that the corresponding data pixel is a background portion.

Regarding the threshold of the number of frames, for example, in a case where the threshold of the time period after voltage is applied to the liquid crystal panel 2 is set to 3 seconds, if the frame rate is 25 frames/second, the threshold of the number of frames is 75 frames. The threshold of the number of frames in this embodiment is set to 75 frames.

However, the present invention is not limited to the threshold "3 seconds" and the threshold of the number of frames "75".

That is, the threshold can be regarded as a value that can be acquired by adding the average value of the above-described histogram to an integral multiple of the standard deviation. Preferably, the threshold is a value that can be acquired by adding the average value of the above-described histogram to two times or more and four times or less the standard deviation. In the case of less than two times, not only a fault but also background noise is detected in excess, and it tends to be difficult to separate a fault and a background from each other. In the case of more than four times, it tends to be difficult to detect a faulty portion because a fault is buried in a background.

Regarding the threshold of the number of frames, in the case of 25 fps, it is preferable that a certain time period be 75 frames or more and 250 frames or less. In the case of less than 75 frames, an insufficient rise in temperature of a faulty portion makes it difficult to separate the fault and background from each other. In the case of more than 250 frames, a calculation load increases (processing time increases), and accordingly the takt-time increases.

Now, the presence/absence of a fault will be described along individual steps with reference to the drawings.

Figure 7:
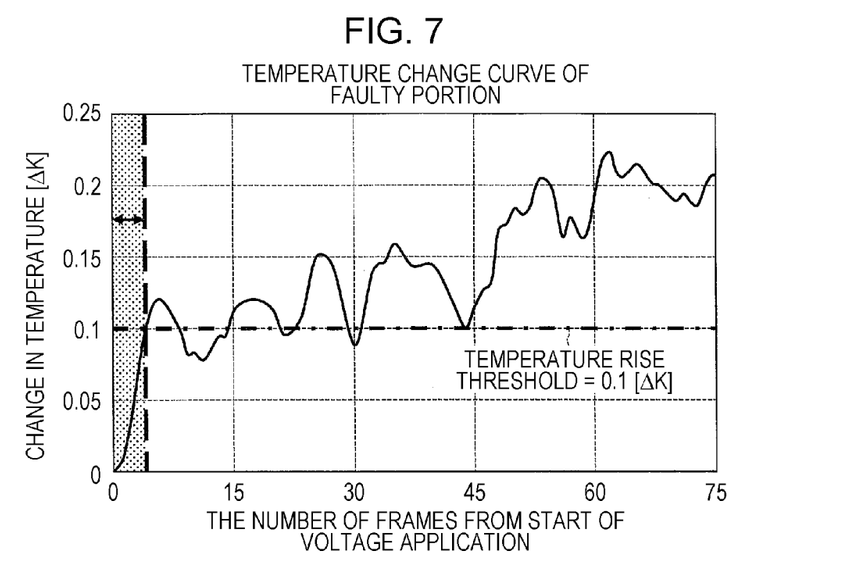
FIG. 7 is a graph illustrating a temperature change curve of a faulty portion according to the embodiment of the present invention.

First, FIG. 7 illustrating a temperature change curve of a faulty portion is referred to. From the curve in the figure, it is understood that it is when the number of frames is about 4 that the temperature rise value exceeds 0.1 ($\Delta K$), which is the temperature rise threshold (S14 and S15). The threshold of the number of frames in this embodiment is 75 frames, as described above, which is more than 4 (step S16). Thus, it can be determined that this data pixel includes a fault. That is, the data pixel can be specified as a faulty portion (S17).

Figure 8:
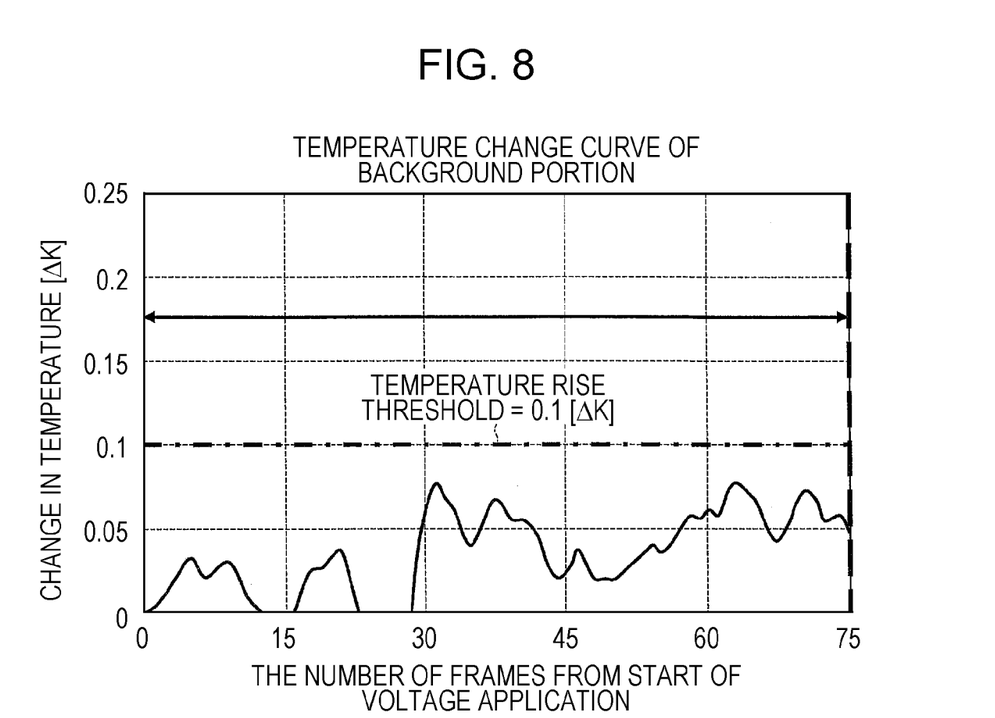
FIG. 8 is a graph illustrating a temperature change curve of a background portion according to the embodiment of the present invention.

Next, FIG. 8 illustrating a temperature change curve in a background portion is referred to. From the curve in the figure, it is understood that the curve reaches the threshold of the number of frames with the temperature rise value not exceeding the temperature rise threshold in any number of frames (S14, S12, and S15). That is, the number of frames in this case does not become smaller than the threshold of the number of frames "75" (S16). Thus, it can be determined that this data pixel does not include a fault. That is, it can be specified that this data pixel is a background portion (S18).

In this way, the presence/absence of a fault in each data pixel is determined by the control unit 7.

In step S19, it is determined whether or not detection has ended for all the data pixels in the liquid crystal panel 2 that is under detection. Here, in a case where detection has not ended for all the data pixels in the liquid crystal panel 2 that is under detection, the process returns to step S11, in which detection is started for the data pixel as the next detection target, and the presence/absence of a fault is determined. On the other hand, in a case where detection has ended for all the data pixels in the liquid crystal panel 2 that is under detection, the process proceeds to the next step S20.

In step S20, it is determined whether or not detection in all the detection modes has ended in the liquid crystal panel 2 that is under detection. Here, in a case where detection in all the detection modes has not ended in the liquid crystal panel 2 that is under detection, the process returns to step S3, in which the connection of the probe 3 is switched for the next detection mode, and fault detection is repeated. On the other hand, in a case where detection in all the detection modes has ended in the liquid crystal panel 2 that is under detection, the process proceeds to the next step S21.

The above-described detection modes are detection methods (methods for applying voltage) corresponding to the types of faulty portion 23 illustrated in FIG. 5. That is, there are three detection modes corresponding to a detection method for a short-circuit fault between a wiring line X and a wiring line Y in part (a) of FIG. 5, a detection method for a short-circuit fault between wiring lines X in part (b) of FIG. 5, and a detection method for a short-circuit fault between wiring lines Y in part (c) of FIG. 5.

In step S21, it is determined whether or not fault detection has ended in all the liquid crystal panels 2 on the mother substrate 1 that is under detection. Here, in a case were fault detection has not ended in all the liquid crystal panels 2, the process returns to step S2, in which the probe is moved to the liquid crystal panel 2 as the next detection target, and fault detection is repeated. On the other hand, in a case where fault detection has ended in all the liquid crystal panels 2, wiring fault detection ends.

(3) Operation and Effect of this Embodiment

According to this embodiment, after a voltage is applied to the liquid crystal panel 2, a temperature value with respect to time is measured for each data pixel in the liquid crystal panel 2. Subsequently, by using the difference from a reference temperature value calculated in advance for each data pixel, a temperature rise value is calculated for each data pixel. Further, a threshold is set for a measurement time period (the number of frames) and a temperature rise value, and thereby the data pixel in which the temperature rise value exceeds the temperature rise threshold in the set time period threshold (the threshold of the number of frames) is determined to include a fault. That is, the data pixel is specified as a faulty portion.

With use of the wiring fault detection method and wiring fault detection apparatus according to this embodiment, even in the case of a fault that is difficult to be detected by using a fault detection method using a difference image of infrared images because change in temperature is insufficient due to low heat generation in the fault, the faulty portion 23 on the substrate can be detected with high accuracy by performing determination using numeric data of temperature rise values or the like without using an infrared image that is visually perceived. In other words, the faulty portion 23 on the semiconductor substrate can be detected with high accuracy regardless of the amount of heat generation (intensity of an infrared image) in the faulty portion 23.

(4) Modification

In this modification, with use of an apparatus similar to the apparatus according to the above-described embodiment, setting is performed in the following manner so that an application voltage V (volt) is different from that of the embodiment.

In the above-described embodiment, in step S6, an application voltage V (volt) proportional to the square root of the resistance value acquired in step S4 is applied to the liquid crystal panel 2. On the other hand, in this modification, an application voltage V (volt) proportional to the resistance value acquired in step S4 is applied to the liquid crystal panel 2 (part (b) of FIG. 1 and FIG. 2).

Specifically, in step S6 according to this embodiment, an application voltage V (volt) is set as expressed by the following equation (6);

[Math. 6]

$$V = m \times R \quad (6),$$

in which m represents a constant and R represents a resistance value (ohm).

Here, a current I (ampere) is expressed by the following equation (7);

[Math. 7]

$$I = V/R = (m \times R)/R = m \quad (7).$$

That is, a current can be made constant by appropriately setting an application voltage.

Here, the resistance value R of a wiring line formed on a substrate is expressed by the following equation (8);

[Math. 8]

$$R = \rho \times L/A \quad (8),$$

in which ρ represents electric resistance, L represents wiring length (meter), and A represents cross section area (square meter).

The electric resistance ρ and the cross section area A are constants that are determined by the type and location of a wiring line. Thus, the resistance value R/L=ρ/A of a wiring line per unit length is also a constant. That is, the resistance value r (i) per unit length of the wiring line i is expressed by the following equation (9);

[Math. 9]

$$r(i) = \rho(i)/A(i) = \text{constant} \quad (9),$$

in which ρ(i) represents the electric resistance of the wiring line i, and A(i) represents the cross section area of the wiring area i, when it is assumed that the number assigned for each type and location of a wiring line is represented by i.

Thus, the amount of heat generation of the wiring line per unit length of the wiring line i is expressed by the following equation (10);

[Math. 10]

$$W(i) = I^2 \times r(i) = m^2 \times r(i) = \text{constant} \quad (10),$$

in which W(i) represents the amount of heat generation of the wiring line i, on the basis of equations (2), (7), and (9) given above.

Figure 9:
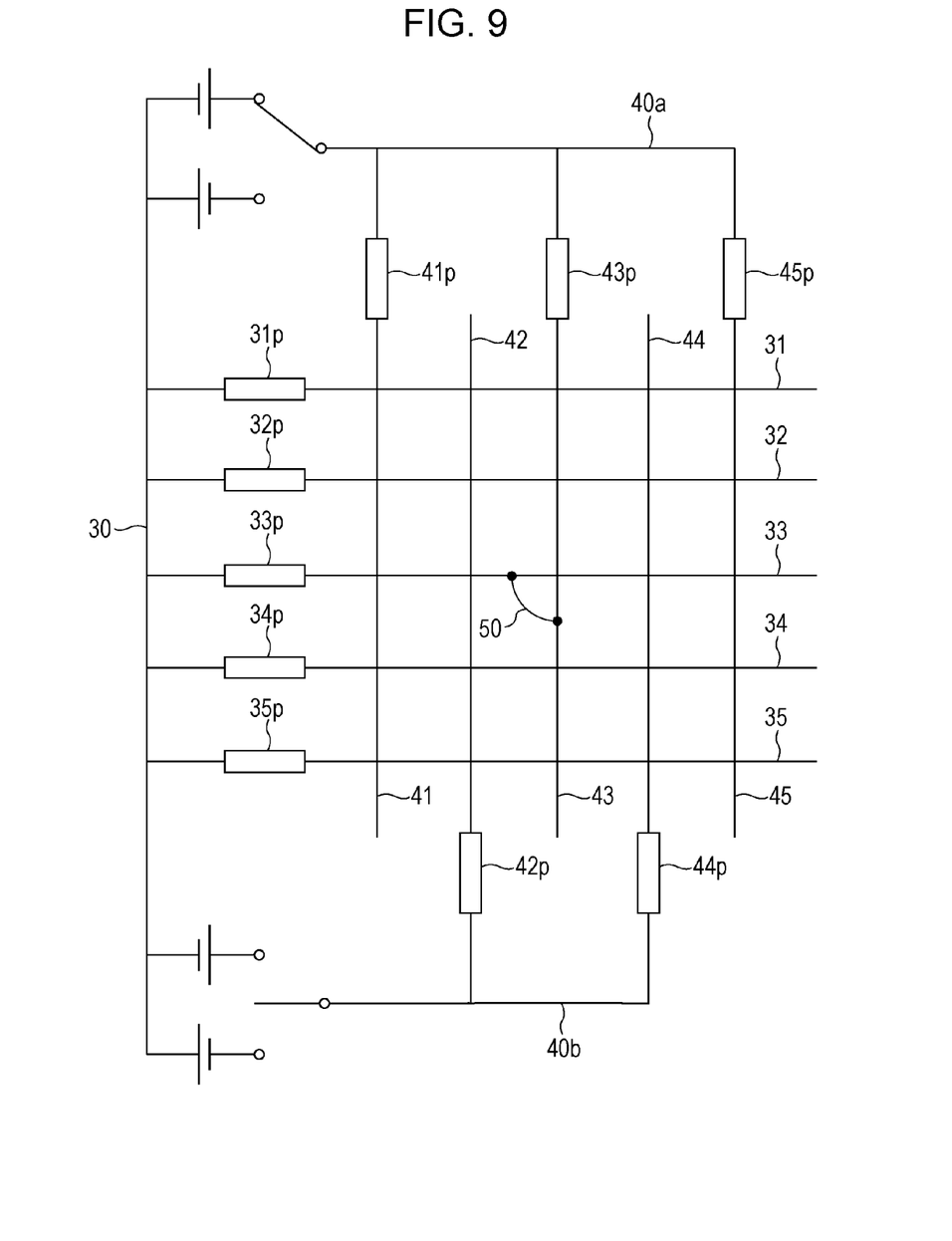
FIG. 9 is a schematic diagram illustrating a short-circuit path used in the embodiment of the present invention.

Here, FIG. 9 is a diagram describing a short-circuit path, and is an example of an electric wiring diagram of a thin film transistor substrate. The thin film transistor substrate in FIG. 9 is a substrate in which scanning lines (wiring lines) 31 to 35 and signal lines (wiring lines) 41 to 45 are arranged in a grid pattern on a glass substrate, thin film transistors and transparent pixel electrodes (not illustrated) are connected to individual intersections, and 5×5 pixels are formed in total. This thin film transistor substrate and a common electrode substrate (not illustrated) are placed in parallel with each other, and liquid crystal is sealed therebetween, thereby a liquid crystal panel is formed. Also, on the thin film transistor substrate, as illustrated in FIG. 9, end portions of individual lead lines 31p to 35p of the scanning lines are connected in common by using a common line 30, so as to prevent electrostatic breakdown. The same applies to the signal lines. On the thin film transistor substrate illustrated in FIG. 9, a short-circuit portion 50 is formed between the scanning line 33 and the signal line 43. In such a thin film transistor substrate, in a case where the short-circuit path is divided to the lead line 33p→the scanning line 33→the short-circuit portion 50→the signal line 43→a lead line 43p, the amount of heat generation of the scanning line 33 and the signal line 43 per unit length can be made constant.

Thus, as a result of appropriately setting a constant m in advance regardless of the electric resistance of the short-circuit portion, the scanning line 33 and the signal line 43 can be stably identified using an infrared image.

Also, as a result of further analyzing the identified wiring portion and specifying the portion in which the scanning line 33 and the signal line 43 are short-circuited, the short-circuit portion can be specified. In a case where the resistance value of the short-circuit portion is large, the amount of heat generation in the short-circuit portion is large, and thus the short-circuit portion can be easily specified using an infrared image.

To set a voltage on the basis of the resistance value of a wiring line, the control unit 7 may perform a process of calculating equation (1) or equation (6) given above each time. Alternatively, the relationship between resistance values and voltages may be stored in a table in advance, and the control unit 7 may set a voltage on the basis of a resistance value by referring to the table each time.

As described above, also with the wiring fault detection method and wiring fault detection apparatus according to this modification, a fault can be identified using an infrared image as in the embodiment.

The present invention is not limited to the above-described embodiments. Those skilled in the art are capable of variously changing the present invention within the scope of the claims. That is, if technical means appropriately changed are combined together within the scope of the claims, a new embodiment can be achieved. That is, the specific embodiments described in the detailed description of the invention are directed to clarifying the technical scope of the invention, which should not be limited to only such specific embodiments and should not be narrowly interpreted. The specific embodiments can be carried out by being variously changed within the spirit of the invention and within the scope of the claims described below.

Overview of the Present Invention

A wiring fault detection method according to the present invention includes:

a voltage application step of applying a predetermined voltage to a wiring line formed on a semiconductor substrate;

a measurement step of continuously measuring, for a certain time period, a temperature of a region of at least a part of the semiconductor substrate to which a voltage is applied in the voltage application step, by using an infrared camera;

a judgment step of judging whether or not a temperature rise value, which is derived by subtracting a temperature value of the semiconductor substrate before the voltage is applied from a temperature value measured in the measurement step, is larger than or equal to a threshold; and a fault determination step of determining that the wiring line formed in the region has a short-circuit fault in a case where it is judged in the judgment step that the temperature rise value is larger than or equal to the threshold, and determining that the wiring line does not have a short-circuit fault in a case where it is judged that the temperature rise value is smaller than the threshold.

According to the above-described configuration, even in the case of a fault that is difficult to be detected by using a fault detection method using a difference image of infrared images because change in temperature is insufficient due to low heat generation in the fault, the fault can be detected with high accuracy by performing judgment using numeric data of temperature rise values or the like without using an infrared image that is visually perceived. In other words, a fault caused by a short circuit on a semiconductor substrate can be detected with high accuracy regardless of the amount of heat generation (intensity of an infrared image) of the fault.

Preferably, in the wiring fault detection method according to the present invention, in addition to the above-described configuration, the threshold used in the judgment step is acquired by, using an average value and a standard deviation of a histogram of a background image created by integrating and averaging differences between adjacent frames of a moving image acquired by continuously imaging, for a certain time period, the semiconductor substrate before the voltage is applied by using the infrared camera, adding the average value to an integral multiple of the standard deviation.

Accordingly, an appropriate threshold can be acquired by appropriately setting the integral, and background noise can be appropriately reduced, and thus a fault can be detected with high accuracy.

Preferably, in the wiring fault detection method according to the present invention, in addition to the above-described configuration, in the voltage application step, a resistance value of the wiring line is measured, a voltage specified on the basis of the measured resistance value is applied, and heat is generated in the wiring line.

According to the above-described configuration, a voltage specified on the basis of a resistance value acquired through a resistance test in advance is applied to a semiconductor substrate (leak fault substrate), which prevents a situation from occurring where too high application voltage cuts a wiring line having a short-circuit fault.

More specifically, the threshold can be acquired by adding the average value to two times or more and four times or less the standard deviation.

Accordingly, as a result of setting the integer in the above-described manner, an optimal temperature rise threshold can be acquired, and background noise can be optimally reduced, and thereby a fault can be detected with high accuracy.

More specifically, in a case of 25 fps (frames per second), the certain time period can correspond to 75 frames or more and 250 frames or less.

Accordingly, as a result of setting the threshold of the number of frames in the above-described manner, a background portion and a faulty portion on a semiconductor substrate can be optimally separated from each other, and a fault can be detected with high accuracy.

A wiring fault detection apparatus according to the present invention includes:

voltage application means for applying a predetermined voltage to a wiring line formed on a semiconductor substrate;

an infrared camera for measuring a temperature of the semiconductor substrate;

measurement means for continuously measuring, for a certain time period, the temperature of the semiconductor substrate using the infrared camera;

judgment means for deriving a temperature rise value by subtracting a temperature value of the semiconductor substrate before the voltage is applied from a temperature value acquired by the measurement means, and judging whether or not the derived temperature rise value is larger than or equal to a threshold; and fault determination means for determining that the wiring line has a short-circuit fault in a case where the judgment means judges that the temperature rise value is larger than or equal to the threshold, and determining that the wiring line does not have the short-circuit fault in a case where the judgment means judges that the temperature rise value is smaller than the threshold, wherein the measurement means, the judgment means, and the fault determination means are provided in a control unit.

According to the above-described configuration, even in the case of a fault that is difficult to be detected by using a fault detection method using a difference image of infrared images because change in temperature is insufficient due to low heat generation in the fault, the fault can be detected with high accuracy by performing judgment using numeric data of temperature rise values or the like without using an infrared image that is visually perceived. In other words, a fault can be detected with high accuracy regardless of the amount of heat generation (intensity of an infrared image) in a faulty portion.

A method for manufacturing a semiconductor substrate according to the present invention includes:

a semiconductor substrate formation step of forming, on a substrate, at least one of a gate electrode, a source electrode, and a drain electrode, a wiring line connected thereto, and a semiconductor film, so as to form a semiconductor substrate on which the wiring line is formed;

a voltage application step of applying a predetermined voltage to the wiring line formed on the semiconductor substrate;

a measurement step of continuously measuring, for a certain time period, a temperature of a region of at least a part of the semiconductor substrate to which a voltage is applied in the voltage application step, by using an infrared camera;

a judgment step of judging whether or not a temperature rise value, which is derived by subtracting a temperature value of the semiconductor substrate before the voltage is applied from a temperature value measured in the measurement step, is larger than or equal to a threshold; and a fault determination step of determining that the wiring line formed in the region has a short-circuit fault in a case where it is judged in the judgment step that the temperature rise value is larger than or equal to the threshold, and determining that the wiring line does not have a short-circuit fault in a case where it is judged that the temperature rise value is smaller than the threshold.

INDUSTRIAL APPLICABILITY

The present invention can be used for detecting a wiring condition of a semiconductor substrate including wiring lines, such as a liquid crystal panel.

REFERENCE SIGNS LIST 1 mother substrate (semiconductor substrate)
2 liquid crystal panel (semiconductor substrate)
3 probe (voltage application means)
4 probe movement means
5, 5a, 5b infrared camera
6 camera movement means
7 control unit (measurement means, judgment means, fault determination means)
8 resistance measurement unit 9 voltage application unit (voltage application means)
10 data storage unit
11 alignment stage
12, 16 optical camera
13a, 13b, 13c, 13d, 13e, 13f guide rail
14a, 14b, 14c, 14d mount portion
17 pixel portion
18 drive circuit portion
19a, 19b, 19c, 19d terminal portion
21a, 21b, 21c, 21d probe portion
23 faulty portion (wiring short-circuit portion)
30, 40a, 40b common line
31, 32, 33, 34, 35 scanning line
31p, 32p, 33p, 34, 35p scanning line lead line
41, 42, 43, 44, 45 signal line
41p, 42p, 43p, 44p, 45p signal line lead line
50 short-circuit portion
100 wiring fault detection apparatus

The invention claimed is:

1. A wiring fault detection method comprising:
 a voltage application step of applying a predetermined voltage to a wiring line formed on a semiconductor substrate;
 a measurement step of continuously measuring, for a certain time period, a temperature of a region of at least a part of the semiconductor substrate to which a voltage is applied in the voltage application step, by using an infrared camera;
 a judgment step of judging whether or not a temperature rise value, which is derived by subtracting a temperature value of the semiconductor substrate before the voltage is applied from a temperature value measured in the measurement step, is larger than or equal to a threshold; and
 a fault determination step of determining that the wiring line formed in the region has a short-circuit fault in a case where it is judged in the judgment step that the temperature rise value is larger than or equal to the threshold, and determining that the wiring line does not have a short-circuit fault in a case where it is judged that the temperature rise value is smaller than the threshold; wherein
 the threshold used in the judgment step is acquired by, using an average value and a standard deviation of a histogram of a background image created by integrating and averaging differences between adjacent frames of a moving image acquired by continuously imaging, for a certain time period, the semiconductor substrate before the voltage is applied by using the infrared camera, adding the average value to an integral multiple of the standard deviation.

2. The wiring fault detection method according to claim 1, wherein, in the voltage application step, a resistance value of the wiring line is measured, a voltage specified on the basis of the measured resistance value is applied, and heat is generated in the wiring line.

3. The wiring fault detection method according to claim 1, wherein the threshold is acquired by adding the average value to two times or more and four times or less the standard deviation.

4. The wiring fault detection method according to claim 1, wherein, in a case of 25 fps, the certain time period corresponds to 75 frames or more and 250 frames or less.

* * * * *